(12) United States Patent
Tiao

(10) Patent No.: US 7,122,405 B2
(45) Date of Patent: Oct. 17, 2006

(54) METHOD FOR PACKAGING CHIP AND PACKAGE ASSEMBLY PRODUCED THEREBY

(75) Inventor: Kuo-Tung Tiao, Hsin Chu (TW)

(73) Assignee: Aiptek International, Inc., Hsin-Chu (TW)

( * ) Notice: Subject to any disclaimer, the term of this patent is extended or adjusted under 35 U.S.C. 154(b) by 0 days.

(21) Appl. No.: 10/995,492

(22) Filed: Nov. 24, 2004

(65) Prior Publication Data
US 2006/0057770 A1  Mar. 16, 2006

(30) Foreign Application Priority Data
Sep. 10, 2004 (TW) .............................. 93127579 A

(51) Int. Cl.
*H01L 21/50* (2006.01)
(52) U.S. Cl. ....................................................... 438/116
(58) Field of Classification Search ................ 438/116, 438/118, 125, 48, 57, 64, 65, 69
See application file for complete search history.

(56) References Cited

U.S. PATENT DOCUMENTS

| | | | |
|---|---|---|---|
| 6,472,247 B1 * | 10/2002 | Andoh et al. ................. 438/64 |
| 6,596,565 B1 | 7/2003 | Hembree ..................... 438/122 |
| 6,657,293 B1 | 12/2003 | Fumihira ..................... 257/698 |
| 6,673,711 B1 | 1/2004 | Tong et al. .................. 438/613 |
| 6,723,630 B1 | 4/2004 | Tong et al. .................. 438/613 |
| 6,744,137 B1 | 6/2004 | Kinsman ..................... 257/737 |
| 6,777,268 B1 | 8/2004 | Jiang .......................... 438/118 |
| 6,781,245 B1 | 8/2004 | Huang ......................... 257/780 |
| 6,784,113 B1 | 8/2004 | Hembree ..................... 438/759 |
| 6,787,921 B1 | 9/2004 | Huang ......................... 257/778 |
| 6,798,053 B1 | 9/2004 | Chiu ........................... 257/684 |
| 6,885,107 B1 * | 4/2005 | Kinsman ..................... 257/778 |

* cited by examiner

*Primary Examiner*—Scott B. Geyer
(74) *Attorney, Agent, or Firm*—Troxell Law Office, PLLC

(57) ABSTRACT

A chip package assembly is produced by preparing a transparent substrate in advance, a chip is electrically connected to a circuit layout of the transparent substrate. Make sure an unoccupied layer is sealed between the transparent substrate and the chip, so as to form the chip package assembly. After the processes mentioned above are done, the chip package assembly can leave the clean room to run post-processes, such as die sawing, or camera module packaging.

13 Claims, 5 Drawing Sheets

METHOD FOR PACKAGING CHIP AND PACKAGE ASSEMBLY PRODUCED THEREBY

BACKGROUND OF THE INVENTION

1. Field of the Invention

The present invention relates to a method for packaging a chip and a chip package assembly produced thereby, and particularly relates to a method that is rather than conventional package technologies and can improve the ability of packaging an optical electronic sensor, for example, the optical electronic sensor connects a predetermined region of a circuit layout of a transparent sheet via a conductive material, in order to form an unoccupied layer therebetween. After each chip is packaged, the transparent sheet is sawed into plurality of dices, the dices can be assembled into various camera module.

2. Description of Related Art

As much progress of electronic products does, such as being lightweight, thin, short and small, and being multiple functions, component packages applied for these electronic products develop with high frequency, quantities of I/O ports and microminiaturize. How to increase the production mass of and how to keep the quality of the component packages are the current issues.

With respect to FIGS. 1A and 1B, an optical electronic sensor package processed by the first conventional package method, a chip scale package (CSP) technology, is disclosed. A substrate 10a is prepared firstly. Secondly, a chip 20a with a micro-lens (μ-lens) array 21a is settled on the substrate, and a conductive pad 22a is arranged on the chip 20a and at the same top surface with the μ-lens array 21a. Thirdly, a terminal wrapping lead 30a is arranged from the conductive pad 22a of the chip 20a to a bottom of the substrate 10a. Fourthly, the bottom of the substrate 10a is dispensed with a solder ball array 11a, which electrically connects the conductive pad 22a via the terminal wrapping lead 30a. Fifthly, an optical paste 50a is coated on the chip 20a in order to stick with a cover glass 40a; a CSP device 1a is thus finally finished. During the post-processes, the CSP device 1a can be secured on to a printed circuit board 70a (a flexible board or a generic rigid board) by a reflow procedure during which the solder ball array 11a will melt for connecting therebetween, and a lens holder 60a, a lens 90a and an infrared ray filter 80a are gathered together on the printed circuit board 70a in sequence as a camera module (in FIG. 1B). As we know, the refraction index of the conventional cover glass 40a is about 1.6, the refraction index of the optical paste 50a is about 1.5, and the refraction index of the μ-lens array 21a is about 1.6. However, the optical paste 50a is filled between the chip 20a and the cover glass 40a, according to Snell's Law, the light passes through the cover glass 40 and is transmitted into the μ-lens array 21a via the optical paste 50a, and the CSP device 1a fails to provide good light convergence capacity and the image sensitivity of the camera module is bad. In addition, the CSP device 1a is obviously difficult to manufacture due to the complicated structure per se and the complex steps, the yield rate cannot raise so that the materials and the cost cannot be saved.

Referring to FIGS. 2A and 2B, an optical electronic sensor package processed by the second conventional package method, a chip on board (COB) technology, is disclosed. Firstly, a chip 20b is disposed on a printed circuit board 70b (generally a rigid board, or a flexible board also can be used), and a μ-lens array 21b and a conductive pad 22b are arranged at the same surface of the chip 20b. Secondly, a golden wire 30b bonds the conductive pad 22b to the printed circuit board 70b for the electrical connection. Thirdly, a lens holder 60b, a lens 90b and an infrared ray filter 80b are gathered together on the printed circuit board 70b in sequence, and further to seal this COB device 1b as a camera module for directly packaging, wherein the infrared ray filter 80b is arranged inside the lens holder 60b, the lens holder 60b is adhered to the printed circuit board 70b in advance, and the lens 90b is assembled into the lens holder 60b (in FIG. 2B). This camera module can be applied for electronic products hereafter. During the COB method, if there is any particle or dust fallen on the μ-lens array 21b of the chip 20b, a kind of critical failure mode will damage the image sensing, the fallen particle cannot be removed by any cleaning means, and therefore, the camera module absolutely fails. Thus, for keeping the COB device 1b from the particles and dusts, the whole process will be practiced in a clean room with high criteria, for example, a class 10 clean room in order to increase the yield rate. But such the clean room is so expensive, and the lager size of the clean room for containing all the equipments used in the COB processes costs more than the regular one. Furthermore, in the clean room, the airflow therein should be kept steady and stable, or the disturbed air and the induced particles will affect the yield rate. Nevertheless, the wire bonding procedure causes the air disturbance due to the high speed thereof.

Hence, an improvement over the prior art is required to overcome the disadvantages thereof.

SUMMARY OF INVENTION

The primary object of the invention is therefore to specify a method for packaging a chip and a chip package assembly produced thereby, in order to simplify the processes, to save the cost, to increase the yield rate and to provide high image sensitivity.

The secondary object of the invention is therefore to specify a method for packaging a chip and a chip package assembly produced thereby, in order to separate from fallen particles and dusts to avoid damaging the image sensing.

The third object of the invention is therefore to specify a method for packaging a chip and a chip package assembly produced thereby, in order to shorten the time in the clean room for further saving cost.

The fourth object of the invention is therefore to specify a method for packaging a chip and a chip package assembly produced thereby, in order to decrease the frequency of the electrical connection in the package to raise the manufacture efficiency.

The fifth object of the invention is therefore to specify a method for packaging a chip and a chip package assembly produced thereby, in order to omitting the reflowing process for increasing the manufacture efficiency.

According to the invention, these objects are achieved by a method for packaging a chip and a chip package assembly produced thereby. Firstly, a transparent substrate is prepared in advance, and a chip is electrically connected to a circuit layout of the transparent substrate. Make sure an unoccupied layer is sealed between the transparent substrate and the chip, so as to form a chip package assembly. The existence of the unoccupied layer can increase the image sensitivity. Because the transparent substrate with the circuit layout plays the role as a cover glass and the unoccupied layer is sealed up, the chip package assembly functions with a circuit board and a cover glass at the same time. After the processes mentioned above are done, the chip package assembly can leave the clean room to run post-processes, such as die sawing, or camera module packaging.

According to the invention, these objects are achieved by a method for packaging a chip that includes the following steps: preparing a transparent substrate; planting a circuit layout on a predetermined region of a first surface of the transparent substrate; providing a chip; arranging a joint pad between the circuit layout of the transparent substrate and the chip; and connecting the chip to the circuit layout of the transparent substrate via the joint pad.

According to the invention, these objects are achieved by a chip package assembly that includes a transparent substrate having a first surface and a circuit layout planted on a predetermined region of the first surface for electrical connection, a joint pad arranged under the circuit layout of the transparent substrate, and a chip connecting with the circuit layout of the transparent substrate via the joint pad.

To provide a further understanding of the invention, the following detailed description illustrates embodiments and examples of the invention. Examples of the more important features of the invention thus have been summarized rather broadly order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

FIG. 4C is a bottom view of the chip package assembly of another embodiment according to the present invention.

DETAILED DESCRIPTION OF THE EMBODIMENTS

Figure 1A:
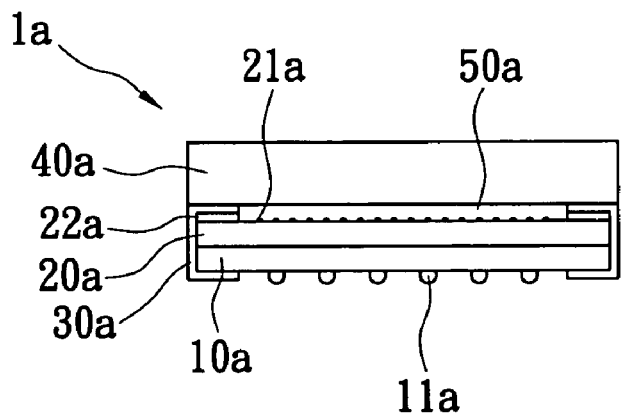
FIG. 1A is a cross-sectional profile of the first conventional method of prior art for packaging an photoelectric chip.
Figure 1B:
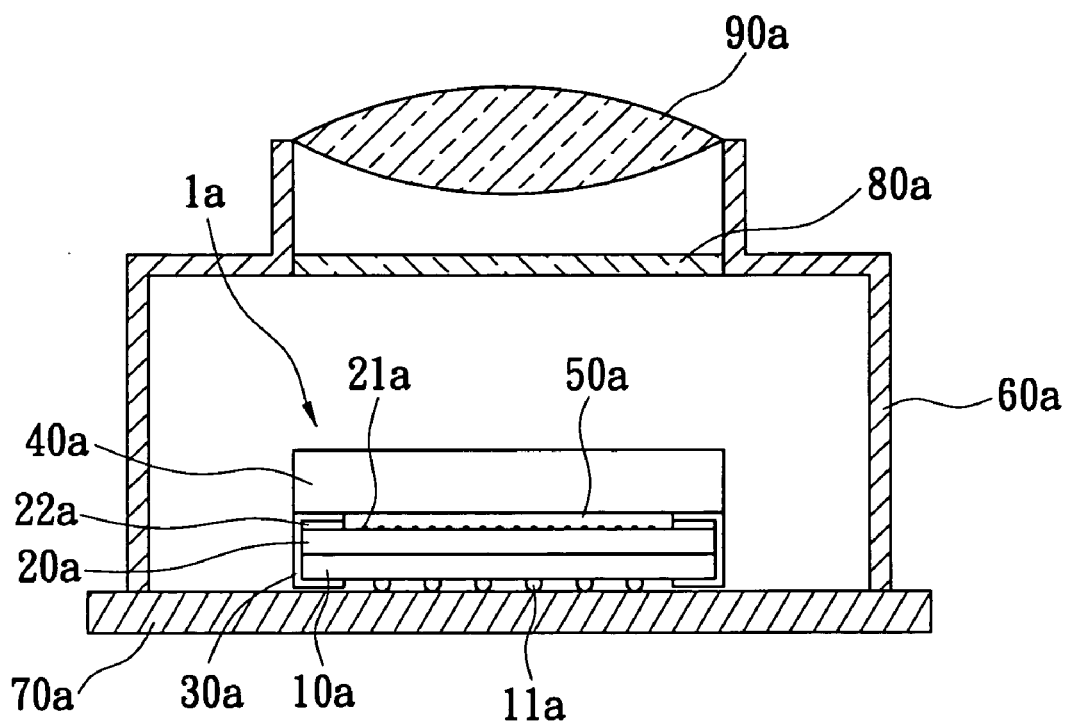
FIG. 1B is a cross-sectional profile of the first conventional method of prior art after the packaged device is applied with the lens holder during the post-process.
Figure 2A:
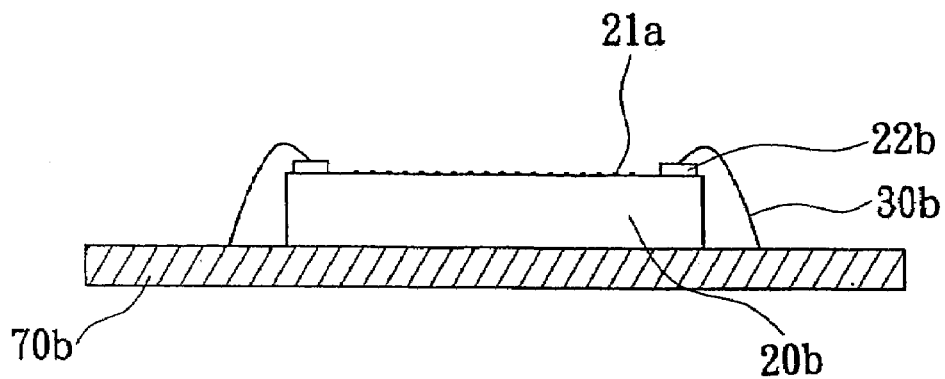
FIG. 2A is a cross-sectional profile of the second conventional method of prior art for packaging an photoelectric chip.
Figure 2B:
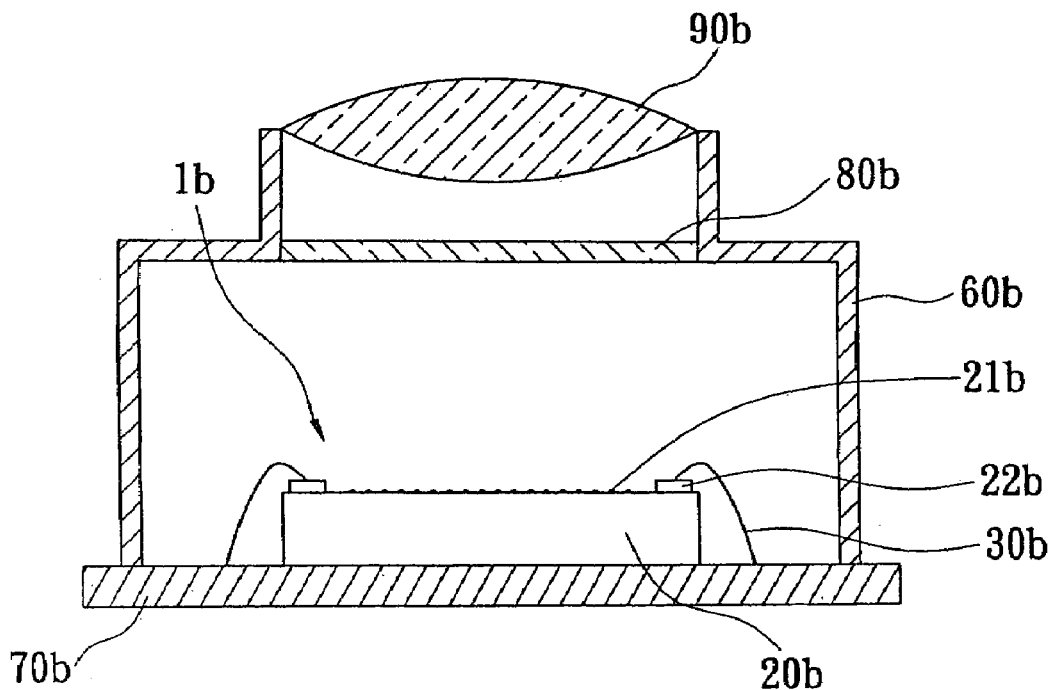
FIG. 2B is a cross-sectional profile of the second conventional method of prior art after the packaged device is applied with the lens holder during the post-process.
Figure 3:
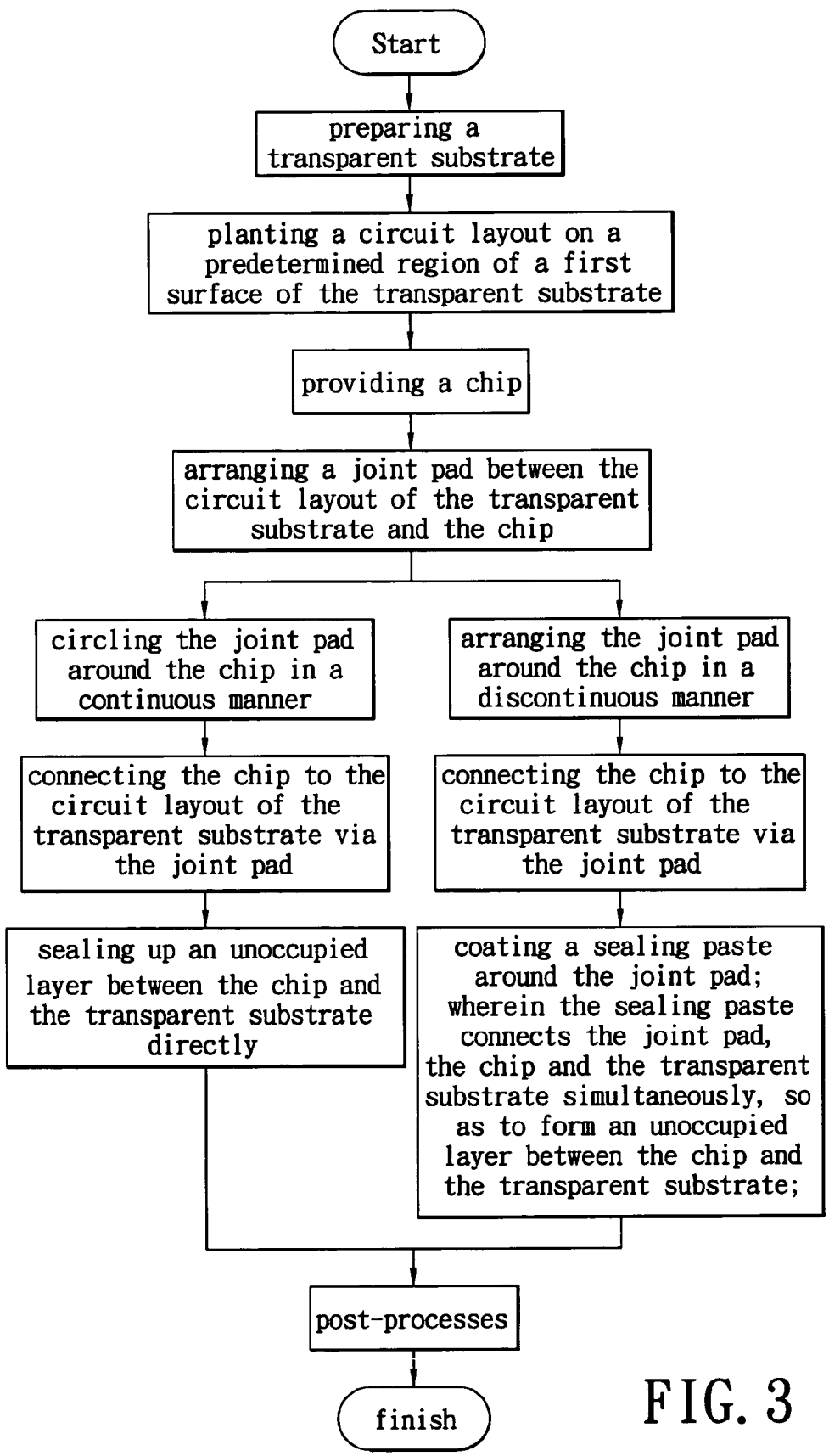
FIG. 3 is a flow chart of the method for packaging an image sensor according to the present invention.
Figure 4A:
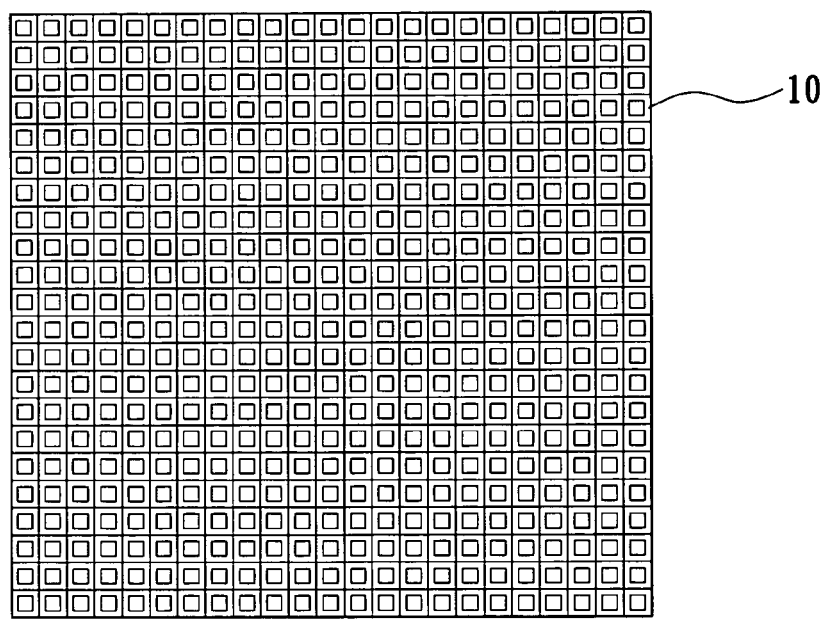
FIG. 4A is a top view of the transparent sheet equipped with a plurality of chip package assemblies before dicing according to the present invention.
Figure 4B:
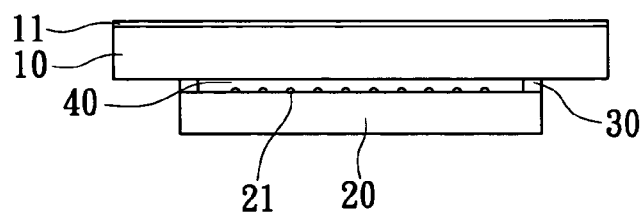
FIG. 4B is a cross-sectional profile of the chip package assembly after dicing according to the present invention.
Figure 4C:
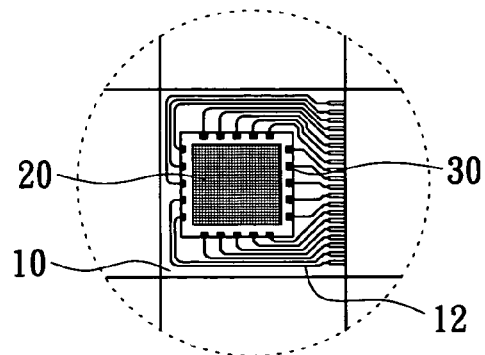
FIG. 4C is a bottom view of the chip package assembly according to the present invention.
Figure 4D:
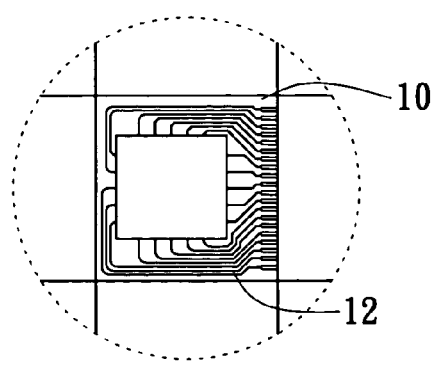
FIG. 4D is a top view of the chip package assembly according to the present invention.
Figure 4E:
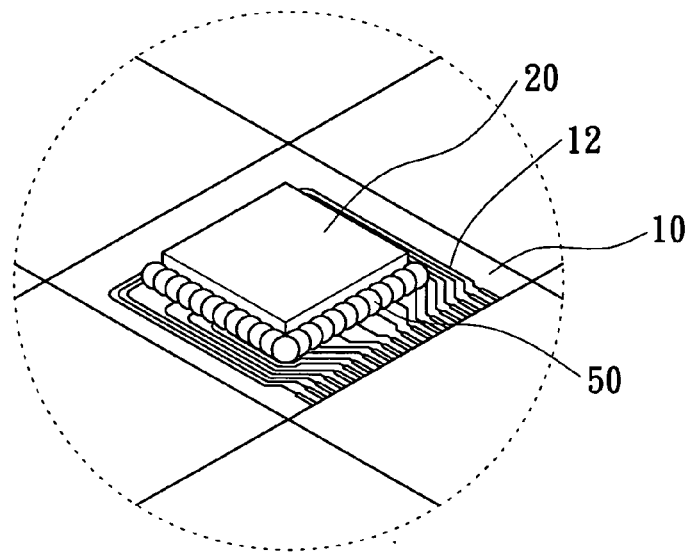
FIG. 4E is an enlarged view of the chip package assembly according to the present invention.
Figure 4F:
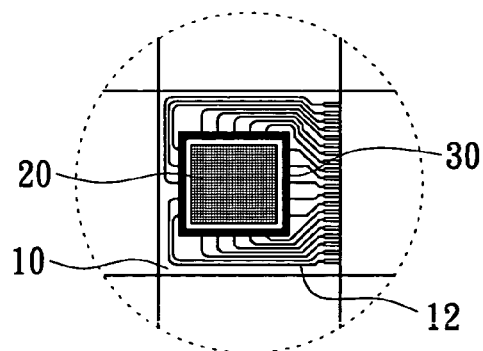

With respect to FIGS. 3, 4A to 4F, preparing a transparent substrate 10 in advance, providing a chip 20 electrically connected to a circuit layout 12 of the transparent substrate 10. Make sure an unoccupied layer 40 is sealed up between the transparent substrate 10 and the chip 20, so as to form a chip package assembly. The existence of the unoccupied layer 40 can increase the image sensitivity. Besides, since the transparent substrate 10 provided with the circuit layout 12 and the chip 20 connects the circuit layout 12 via a joint pad 30, the chip package assembly functions with a circuit board and a cover glass (for prevent from particles and dusts) at the same time. After the processes mentioned above are done, the chip package assembly can leave the clean room to run the conventional post-processes, such as die sawing or camera module packaging. The method for packaging the chip is rather than a conventional package technology and can improve the ability of packaging a photoelectric chip, so that the camera module size can be shrank, the processes can be simplified, the materials and the labor can be saved, and the manufacture efficiency can be improved at the same time. Obviously, the method according tot eh present invention is with real low cost and huge effects for applying in the optical electronic sensor packaging plants.

The method for packaging a chip according to the present invention includes the following steps: (a) preparing the transparent substrate 10, wherein the transparent substrate 10 is made of optical glass (or can be made of quartz, but more expensive). The shape of the transparent substrate 10 cannot restrict the application thereof; the round transparent substrate 10 or the rectangular transparent substrate 10 will be fine. In the preferred embodiment, the transparent substrate 10 is spurted with an electromagnetic wave reflection layer or further with an infrared ray filtering film 11 in order to take place of the infrared ray filter 80a or 80b in the conventional technologies. (b) Planting the circuit layout 12 on a predetermined region of a first surface of the transparent substrate 10, wherein the infrared ray filtering film 11 is disposed on a second surface of the transparent substrate 10 to opposite the circuit layout 12 arranged on the first surface thereof. The infrared ray filtering film 11 and the circuit layout 12 are alternatively formed on a top surface and a bottom surface of the transparent substrate 10. (c) Providing the chip 20, the chip 20 has a micro-lens array 21 disposed on a surface thereof to face the first surface of the transparent substrate 10. The chip 20 is an optical electronic sensor with a pixel array, which corresponds to the micro-lens array 21, such as a CMOS (Complementary Metal-Oxide Semi conductor), a CCD (Charge Coupled Device), or a CIS (Contact Image Sensor); or the chip 20 is composed of a plurality of LEDs (Light Emission Diode) arranged to correspond to the micro-lens array one on one. (d) Arranging the joint pad 30 between the circuit layout 12 of the transparent substrate 10 and the chip 20. (e) Connecting the chip 20 to the first surface, arranged with the circuit layout 12, of the transparent substrate 10 via the joint pad 30, wherein the joint pad 30 is made from a conductive material, such as a golden pump, or an anisotropic conductive film and paste (ADF). If the joint pad 30 is made from the golden pump, the golden bump is made on the chip 20 or on the circuit layout 12 of the transparent substrate 10 in advance, and the chip 20 and the circuit layout 12 of the transparent substrate 10 will be welded to each other by the golden bump. If the joint pad 30 is made from the ADF, the ADF can be made on the chip 20 or on the circuit layout 12 of the transparent substrate 10 in advance, as same as the golden bump, thus the chip 20 and the circuit layout 12 of the transparent substrate 10 will be stuck to each other. Any way, the chip 20 connects the circuit layout 12 of the transparent substrate 10 electrically via the joint pad 30. In regard to FIG. 4F, an arrangement embodiment of the joint pad 30 is disclosed. The joint pad 30 is circled around the chip 20 in a continuous manner in order to form the unoccupied layer 40 between the chip 20 and the transparent substrate 10 directly. The unoccupied layer 30 is formed by pumping into vacuum, being full of air naturally, or pouring an inert gas between the chip 20 and the transparent substrate 10. If the transparent substrate 10 is made of a glass, and the refraction index of the glass is about 1.6, the refraction index of the micro lens is about 1.6, and the refraction index of vacuum is about 1. According to Snell's Law, the light passes through the transparent substrate 10 and is transmitted into the μ-lens array 21 via the vacuum, and the chip package assembly provide good light convergence capacity and the image sensitivity of the camera module is excellent. Another arrangement embodiment of the joint pad 30 is disclosed in FIG. 4E. The joint pad 30 is arranged in a discontinuous manner and made of a conductive material and an insulative material in an alternate manner. The conductive material is made from a golden pump, or an anisotropic conductive film and paste (ADF). Therefore, the method further includes a step: (f) coating a sealing paste 50 around the joint pad 30, wherein the sealing paste 40 connects the joint pad 30, the chip 20 and the transparent substrate 10 simultaneously, so as to seal up the unoccupied layer 40 between the chip 20 and the transparent substrate 10 for isolation.

The method according to the present invention discloses the transparent substrate 10 provided with the circuit layout 12, the chip 20 connected to the transparent substrate 10 via the joint pad 30, and the unoccupied layer 40 sealed up between the chip 20 and the transparent substrate 10 for producing the chip package assembly. The transparent substrate 10 functions not also as the printed circuit board in the conventional technologies, but also as the cover glass for preventing from particles and dusts. The fallen particles onto the transparent substrate 10 can be removed directly by alcohol or IPA (Isopropyl alcohol), so as to decrease the critical failure modes that damage the image sensing. The method according to the present invention can be practiced with simple steps to avoid the soldering process or the wire bonding processes in the CSP or COB technologies, particularly the omission of the soldering process can diminish the risks of the product damages. In addition, too many electrical connections (the chip 20a electrically connects the conductive pad 22a and the solder ball array 11a via the terminal wrapping lead 30a, and the chip 20a electrically connects the printed circuit board 70a via the solder ball array 11a.) in the CSP technology will prolong the produce time. In the present invention, this problem can be solved, too. Furthermore, the chip package assembly is sealed up for isolation and can leave the clean room early. The processes and the equipments in the clean room both will be reduced to save money.

The chip package assembly disclosed in FIGS. 4A to 4F includes the transparent substrate 10 having the first surface and the circuit layout 12 planted on a predetermined region of the first surface for electrical connection, the joint pad 30 arranged under the circuit layout 12 of the transparent substrate 10, and the chip 20 connecting with the circuit layout 12 of the transparent substrate 10 via the joint pad 30. The transparent substrate 10 is made of optical glass (or can be made of quartz, but more expensive). The chip 20 has a micro-lens array 21 disposed on the surface thereof to face the first surface of the transparent substrate 10. The unoccupied layer 40 is formed and sealed up between the chip 20 and the transparent substrate 10. In regard to FIG. 4F, the joint pad 30 is circled around the chip 20 in a continuous manner in order to form the unoccupied layer 40 between the chip 20 and the transparent substrate 10 directly. The unoccupied layer 40 is a layer of vacuum, air or inner gas. The joint pad 30 is made from a golden pump, an anisotropic conductive film and paste (ADF), or other conductive materials. Another arrangement embodiment of the joint pad 30 is disclosed in FIG. 4E. The joint pad 30 is arranged in a discontinuous manner and made of a conductive material and an insulative material in an alternate manner. The conductive material is made from a golden pump, or an anisotropic conductive film and paste (ADF). The conductive material is used for electrically connecting the chip 20 and the circuit layout 12. The joint pad 30 is made on the chip 20 or on the circuit layout 12 of the transparent substrate 10 in advance. Therefore, the sealing paste 50 is arranged round the joint pad 30 to connect the joint pad 30, the chip 20 and the transparent substrate 10 simultaneously, so as to seal up the unoccupied layer 40 between the chip 20 and the transparent substrate 10 for isolation.

The transparent substrate 10 is spurted with an electromagnetic wave reflection layer that reflects a predetermined wave spectrum of the electromagnetic wave or further with an infrared ray filtering film 11 in order to take place of the infrared ray filter 80a or 80b in the conventional technologies. The infrared ray filtering film 11 is disposed on the second surface of the transparent substrate 10 that is opposite the first surface thereof. Besides the CMOS, the CCD or the CIS can be used as the optical electronic sensor; the chip 20 can be composed of a plurality of LEDs arranged on a transparent sheet and further sawed into proper scales and sizes dices to apply to a commercial board for showing messages or words. The LEDs with the transparent substrate 10 can be sputtered with a reflection/interference film thereon for enhancing the color contrast of the LEDs.

Advantages of the present invention are:

1. To provide a chip package assembly with high image sensitivity.

2. To provide a chip package assembly that can simplify the processes, save the cost, and increase the yield rate.

3. The fallen particles and dusts can be avoid damaging the image sensing.

4. To shorten the times in the clean room for further saving cost.

5. To decrease the frequency of the electrical connection in the package to raise the manufacture efficiency.

6. To omitting the reflowing process for increasing the manufacture efficiency.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method for packaging a chip, comprising the steps:
   preparing a transparent substrate;
   planting a circuit layout on a predetermined region of a first surface of the transparent substrate;
   providing a chip;
   arranging a joint pad between the circuit layout of the transparent substrate and the chip;
   connecting the chip to the circuit layout of the transparent substrate via the joint pad;
   arranging an electromagnetic wave reflection layer on a second surface of the transparent substrate;

wherein the second surface is opposite to the first surface of the transparent substrate, and the electromagnetic wave reflection layer reflects a predetermined wave spectrum of the electromagnetic wave.

2. The method as claimed in claim 1, wherein the step of the joint pad arrangement further includes the steps:

arranging the joint pad around the chip in a discontinuous manner; and coating a sealing paste around the joint pad;

wherein the sealing paste connects the joint pad, the chip and the transparent substrate simultaneously, so as to form an unoccupied layer between the chip and the transparent substrate.

3. The method as claimed in claim 2, wherein the unoccupied layer is formed by a step:

pumping into vacuum;

being full of air naturally; or pouring an inert gas between the chip and the transparent substrate.

4. The method as claimed in claim 2, wherein the joint pad is made from a conductive material, such as a golden bump, or an anisotropic conductive film and paste (ADF).

5. The method as claimed in claim 1, wherein the step of the joint pad arrangement further includes the steps:

circling the joint pad around the chip in a continuous manner in order to form an unoccupied layer between the chip and the transparent substrate.

6. The method as claimed in claim 5, wherein the unoccupied layer is formed by a step:

pumping into vacuum;

being full of air naturally; or pouring an inert gas between the chip and the transparent substrate.

7. The method as claimed in claim 5, wherein the joint pad is made of a conductive material and an insulative material in an alternate manner.

8. The method as claimed in claim 7, wherein the conductive material is made from a golden bump, or an anisotropic conductive film and paste (ADF).

9. The method as claimed in claim 1, wherein the joint pad is made on the chip or on the circuit layout of the transparent substrate in advance.

10. The method as claimed in claim 1, wherein the transparent substrate is made of optical glass or quartz.

11. The method as claimed in claim 1, wherein the step of the electromagnetic wave reflection layer arrangement further includes a step:

sputtering an infrared ray filtering film on the second surface of the transparent substrate.

12. The method as claimed in claim 1, wherein the chip has a micro-lens array disposed on a surface thereof to face the first surface of the transparent substrate.

13. The method as claimed in claim 12, wherein the chip is an optical sensor with a pixel array, which corresponds to the micro-lens array; or the chip is composed of a plurality of LEDs (Light Emission Diode) arranged to correspond to the micro-lens array one on one.

* * * * *